(12) United States Patent
Ho et al.

(10) Patent No.: US 8,502,389 B2
(45) Date of Patent: Aug. 6, 2013

(54) CMOS IMAGE SENSOR AND METHOD FOR FORMING THE SAME

(75) Inventors: Cheng-Ying Ho, Minxiong Township (TW); Dun-Nian Yaung, Taipei (TW); Jen-Cheng Liu, Hsin-Chu (TW); Jeng-Shyan Lin, Tainan (TW); Wen-De Wang, Minsyong Township (TW); Shih Pei Chou, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/205,157

(22) Filed: Aug. 8, 2011

(65) Prior Publication Data
US 2013/0037958 A1    Feb. 14, 2013

(51) Int. Cl.
*H01L 23/48* (2006.01)
*H01L 31/00* (2006.01)

(52) U.S. Cl.
USPC ............ 257/774; 257/59; 257/228; 257/459; 257/460; 257/744; 257/E27.131; 257/E2.133; 257/E23.011; 257/E31.114; 438/59; 438/70; 438/98

(58) Field of Classification Search
USPC .................. 257/59, 228, 459, 560, 744, 774, 257/E23.011, E27.131, E27.133, E31.114; 438/59, 70, 98
See application file for complete search history.

(56) References Cited

U.S. PATENT DOCUMENTS

| | | | |
|---|---|---|---|
| 7,582,502 B1 | 9/2009 | Hwang et al. | |
| 8,217,484 B2* | 7/2012 | Park | 257/459 |
| 2009/0146148 A1* | 6/2009 | Pyo | 257/59 |
| 2009/0309232 A1* | 12/2009 | Roy | 257/774 |
| 2010/0167447 A1* | 7/2010 | Kim | 438/59 |

* cited by examiner

*Primary Examiner* — Dao H Nguyen
(74) *Attorney, Agent, or Firm* — Slater & Matsil, L.L.P.

(57) ABSTRACT

An integrated circuit structure includes an interconnect structure that includes a plurality of metal layers, wherein the interconnect structure is under a semiconductor substrate. A metal pad is formed in one of the plurality of metal layers. A dielectric pad extends from a bottom surface of the semiconductor substrate up into the semiconductor substrate. An opening extends from a top surface of the semiconductor substrate down to penetrate through the semiconductor substrate and the dielectric pad. An edge of the semiconductor substrate in the opening is vertically aligned to an edge of the dielectric pad in the opening. The opening stops on a top surface of the metal pad. A dielectric spacer is disposed in the opening, wherein the dielectric spacer is formed on the edge of the semiconductor substrate and the edge of the dielectric pad.

20 Claims, 8 Drawing Sheets

CMOS IMAGE SENSOR AND METHOD FOR FORMING THE SAME

BACKGROUND

Backside illumination (BSI) image sensor chips are replacing front side illumination sensor chips for their higher efficiency in capturing photons. In the formation of the BSI image sensor chips, image sensors and logic circuits are formed on a silicon substrate of a wafer, followed by the formation of an interconnect structure on a front side of the silicon chip. The interconnect structure includes a plurality of metal layers including bottom metal layer M1 through top metal layer Mtop.

The wafer is then flipped over. A backside grinding is performed on the silicon substrate from the backside of the silicon substrate. A buffer oxide layer may be formed over the back surface of the remaining silicon substrate, and a first opening is formed to extend from the buffer oxide layer to stop at a shallow-trench isolation (STI) pad that is formed in the silicon substrate. A second opening is then formed inside the first opening to further etch the STI pad and the interlayer dielectric (ILD) that is directly under the etched portion of the STI pad, so that a metal pad in the bottom metal layer M1 is exposed. The second opening is smaller than the first opening. An aluminum copper pad is then formed in the first and the second openings and electrically coupled to the metal pad in metal layer M1. The aluminum copper pad may be used for bonding to the BSI chip.

In the above-discussed conventional formation process for forming the aluminum copper pad, two masks are required to define the patterns of the first opening and the second opening. The resulting structure is free from the electrical short between the aluminum copper pad and the silicon substrate, and is free from the electrical short between aluminum copper pads. Also, through the above-discussed processes, a clear BSI alignment mark (known as a scribe-line primary mark (SPM)) may be formed for the alignment of the subsequent formation of color filters.

In the above-discussed process steps, the formation of each of the first and the second openings requires a corresponding lithography, etching, and photo resist removal process. The manufacturing cost is thus high.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A pad structure for backside illumination (BSI) image sensor chips and the method of forming the same are provided in accordance with various embodiments. The intermediate stages of forming BSI pad structures are illustrated. The variations of the embodiments are discussed. Throughout the various views and illustrative embodiments, like reference numbers are used to designate like elements.

Figure 1:
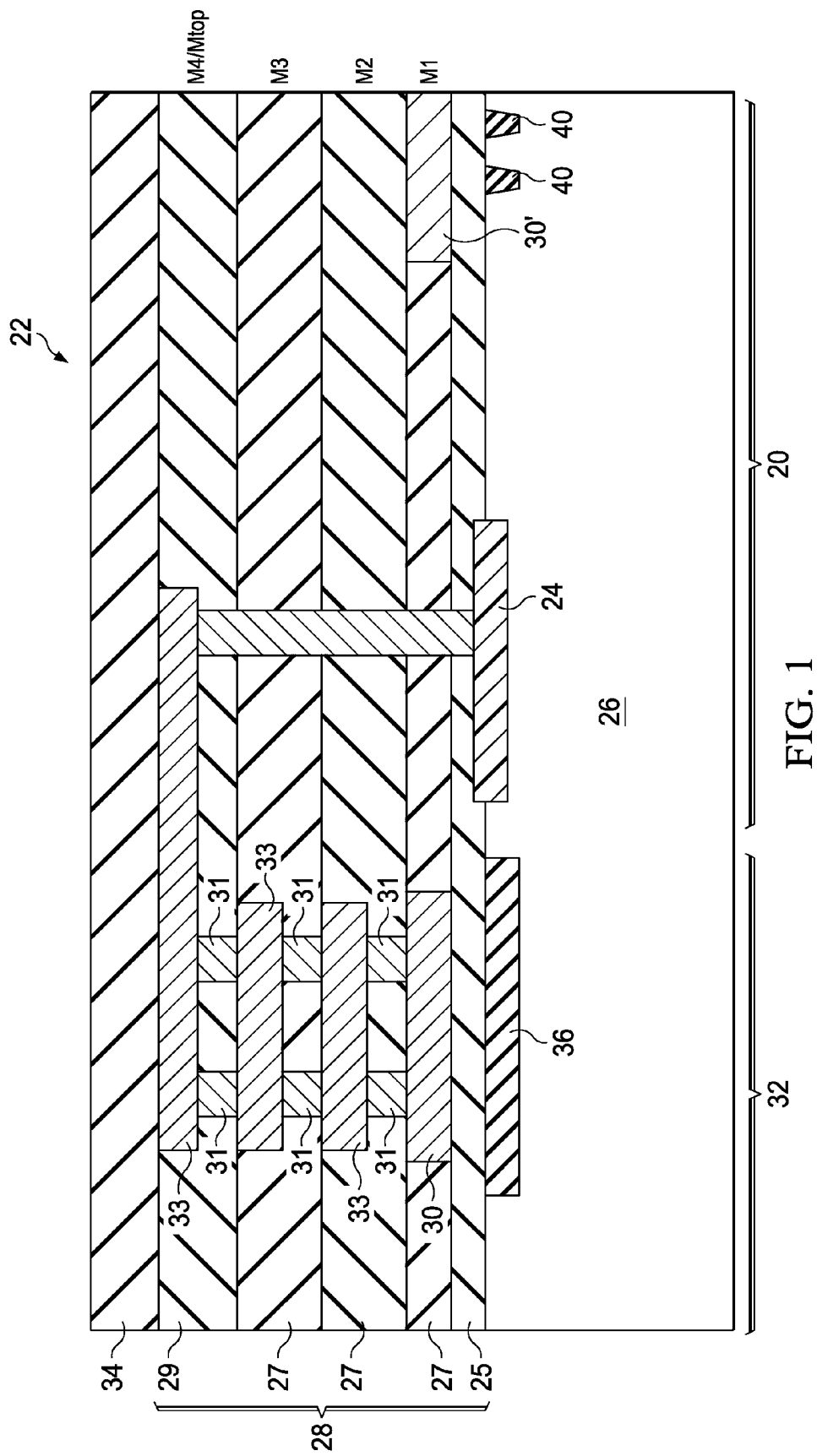
FIGS. 1 through 7 are cross-sectional views of intermediate stages in the manufacturing of pad structures in an image sensor chip in accordance with various embodiments, wherein a scribe-line primary mark (SPM) is formed as a part of an interlayer dielectric.

FIGS. 1 through 7 illustrate the cross-sectional views of intermediate stages in the manufacturing of pad structures in accordance with some embodiments. FIG. 1 illustrates image sensor chip 20, which may be part of wafer 22. Image sensor chip 20 includes semiconductor substrate 26, which may be a crystalline silicon substrate or a semiconductor substrate formed of other semiconductor materials. Image sensor 24, which may be a photo-sensitive MOS transistor or a photo-sensitive diode, is formed at the surface of semiconductor substrate 26. Accordingly, wafer 22 may be an image sensor wafer. Dielectric pad 36, which may be a shallow-trench isolation (STI) pad, extends from a top surface of semiconductor substrate 26 into semiconductor substrate 26.

Interconnect structure 28 is formed over semiconductor substrate 26, and is used to electrically interconnect the devices in image sensor chip 20. Interconnect structure 28 includes interlayer dielectric (ILD) 25 formed over semiconductor substrate 26, wherein contact plugs (not shown) that are connected to the devices in wafer 22, such as transistors, are formed in ILD 25. The metal layers include metal lines 33, metal pads (such as 30), and vias 31 in dielectric layers 27 and 29.

The metal layers are marked as M1, M2 . . . and Mtop, wherein metal layer M1 is the bottom metal layer of interconnect structure 28, and metal layer Mtop is the top metal layer of interconnect structure 28. In the illustrated embodiments, there are four metal layers, and metal layer Mtop is M4. However, wafer 22 may include more or fewer metal layers. In an embodiment, top metal layer Mtop is formed in non-low-k dielectric layer 29, which may be formed of un-doped silicate glass (USG), for example, while the underlying dielectric layers 27 are low-k dielectric layers having low k values, for example, lower than about 3.0, or lower than about 2.5.

Metal pad 30 (and other metal pads) may be disposed in any of metal layers M1 through Mtop. In an exemplary embodiment, metal pad 30 is formed in metal layer M1. Metal pad 30 may be electrically coupled to image sensor 24 and/or other logic devices such as transistors (not shown). The electrical connection between image sensor 24 and metal pad 30 may be made through any of the metal layers M1 through Mtop. For example, in the illustrated embodiment in FIG. 1, the electrical connection between image sensor 24 and metal pad 30 is made through metal lines 33 and vias 31. Passivation layer 34, which may be formed of a silicon oxide layer and a silicon nitride layer on the silicon oxide layer, for example, is formed over interconnect structure 28.

Metal pad 30 may be formed in scribe line 32, which is between image sensor chip 20 and a neighboring image sensor chip (not shown). A portion of metal pad 30 vertically overlaps a portion of STI pad 36. In a subsequent die saw process, wafer 22 will be sawed into a plurality of image sensor chips. However, metal pad 30 is not sawed apart, and remains in the same chip as the illustrated image sensor chip 20. Accordingly, metal pad 30 is also referred to as being inside image sensor chip 20 although it is actually in a scribe line. Scribe-line primary mark (SPM) 40, which may be formed of the same material as, and formed simultaneously as, STI pad 36, is also located in semiconductor substrate 26.

Figure 2:
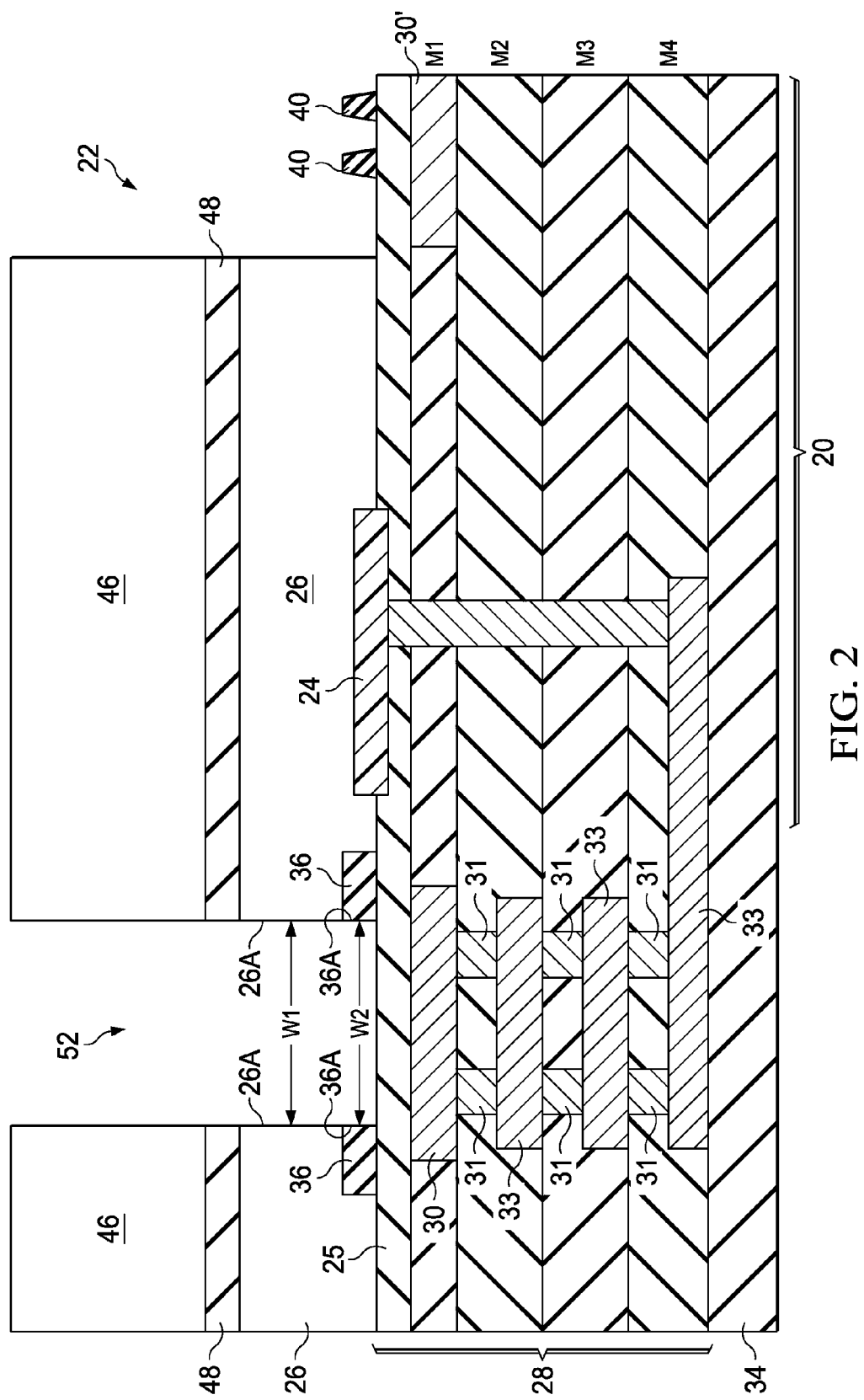

Referring to FIG. 2, wafer 22 is flipped upside down, and is attached to a carrier (not shown) that is under wafer 22. Semiconductor substrate 26 thus faces up. A backside grinding step is performed to thin semiconductor substrate 26, until the thickness of wafer 22 is smaller than about 20 μm, or smaller than 10 μm. At this thickness, light can penetrate through the remaining semiconductor substrate 26, and reach image sensor 24. After the thinning, buffer oxide layers 48 may be formed on the backside of semiconductor substrate 26. In an embodiment, buffer oxide layer 48 may include a silicon oxide layer, a bottom anti-reflective coating (BARC) layer over the silicon oxide layer, and another oxide layer over the BARC layer, although buffer layer 48 may have different structures and formed of different materials.

Mask 46, which may be a photo resist layer, is formed over wafer 22 and then patterned. Semiconductor substrate 26 is then etched to form opening 52. Opening 52 is a through-substrate opening that penetrates through semiconductor substrate 26. It is noted that for illustrating the details in metal layers, the aspect ratio of the illustrated opening 52 is much greater than the aspect ratio of the actual opening 52 that is formed on a wafer. The actual opening 52 may have a width significantly greater than, sometimes tens of times as, the height of the respective opening 52.

STI pad 36 is also etched through in the same etching step for etching semiconductor substrate 26. Since semiconductor substrate 26 and STI pad 36 are etched using the same mask 46, edges 26A of semiconductor substrate 26 facing opening 52 are vertically aligned to edges 36A of STI pad 36 facing opening 52. Opening 52 includes a first portion in semiconductor substrate 26 and a second portion in STI pad 36. Since semiconductor substrate 26 and STI pad 36 are etched using a same mask, width W1 of the first portion is substantially equal to width W2 of the second portion, wherein widths W1 and W2 are measured close to the interface of semiconductor substrate 26 and in STI pad 36. The etch step stops on ILD 25. At the time opening 52 is formed, the portion of semiconductor substrate 26 covering SPM 40 is also removed, and SPM 40 is exposed.

Figure 3:
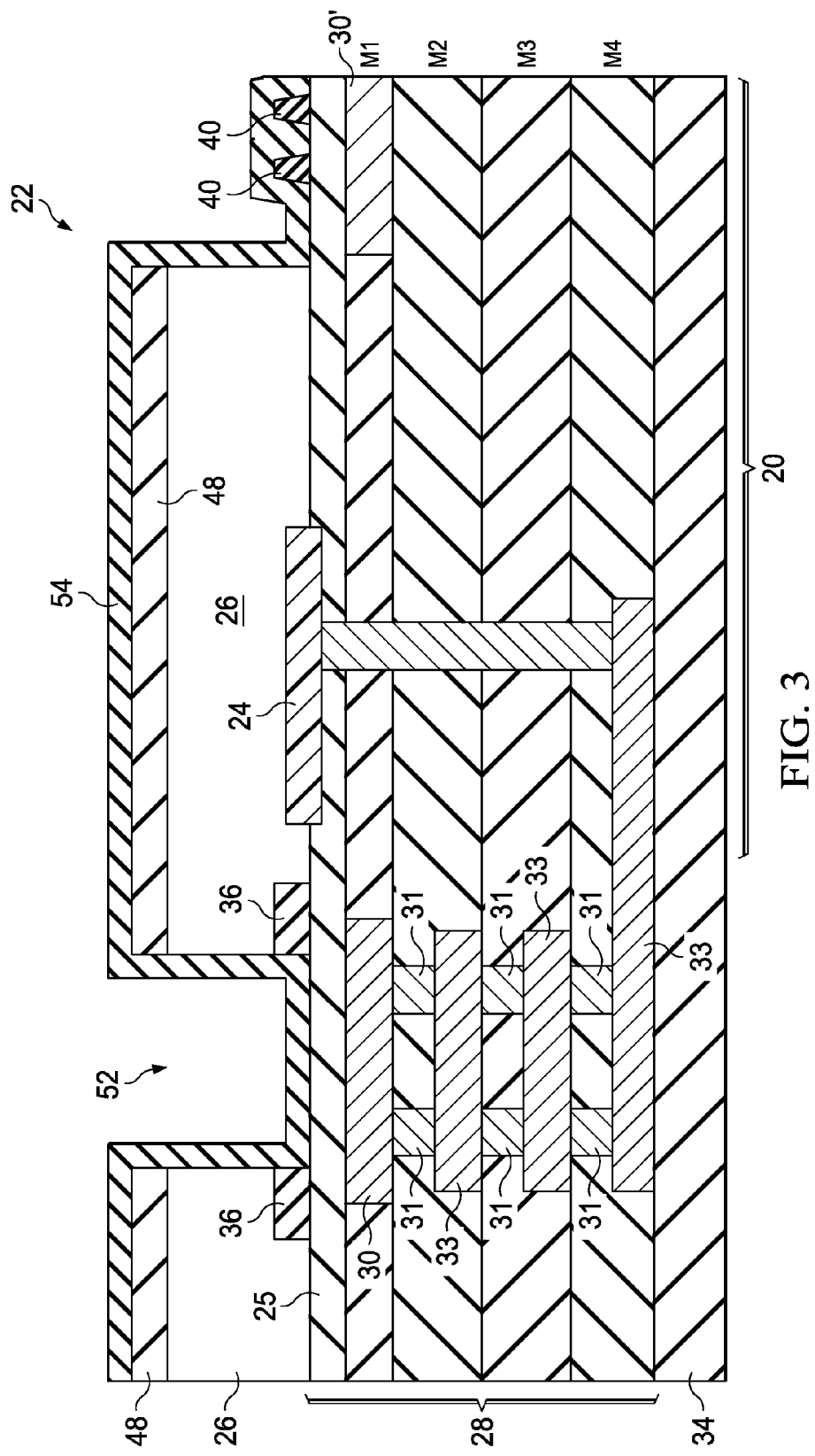

Referring to FIG. 3, dielectric layer 54 is formed. Dielectric layer 54 extends into opening 52, and is formed on the top surface of buffer oxide layer 48. An etch-back is then performed to etch dielectric layer 54, so that the horizontal portions of dielectric layer 54 are removed. The vertical portions of dielectric layer 54 remain on the sidewall of opening 52, and form sidewall spacer 56, as shown in FIG. 4A. The outer edge of dielectric spacer 56 thus contacts the edge of semiconductor substrate 26 and the edge of STI pad 36. Sidewall spacer 56 has a bottom surface landing on the top surface of ILD 25.

Figure 4B:
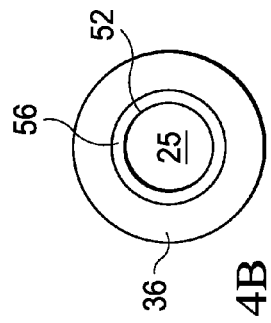
Figure 4A:
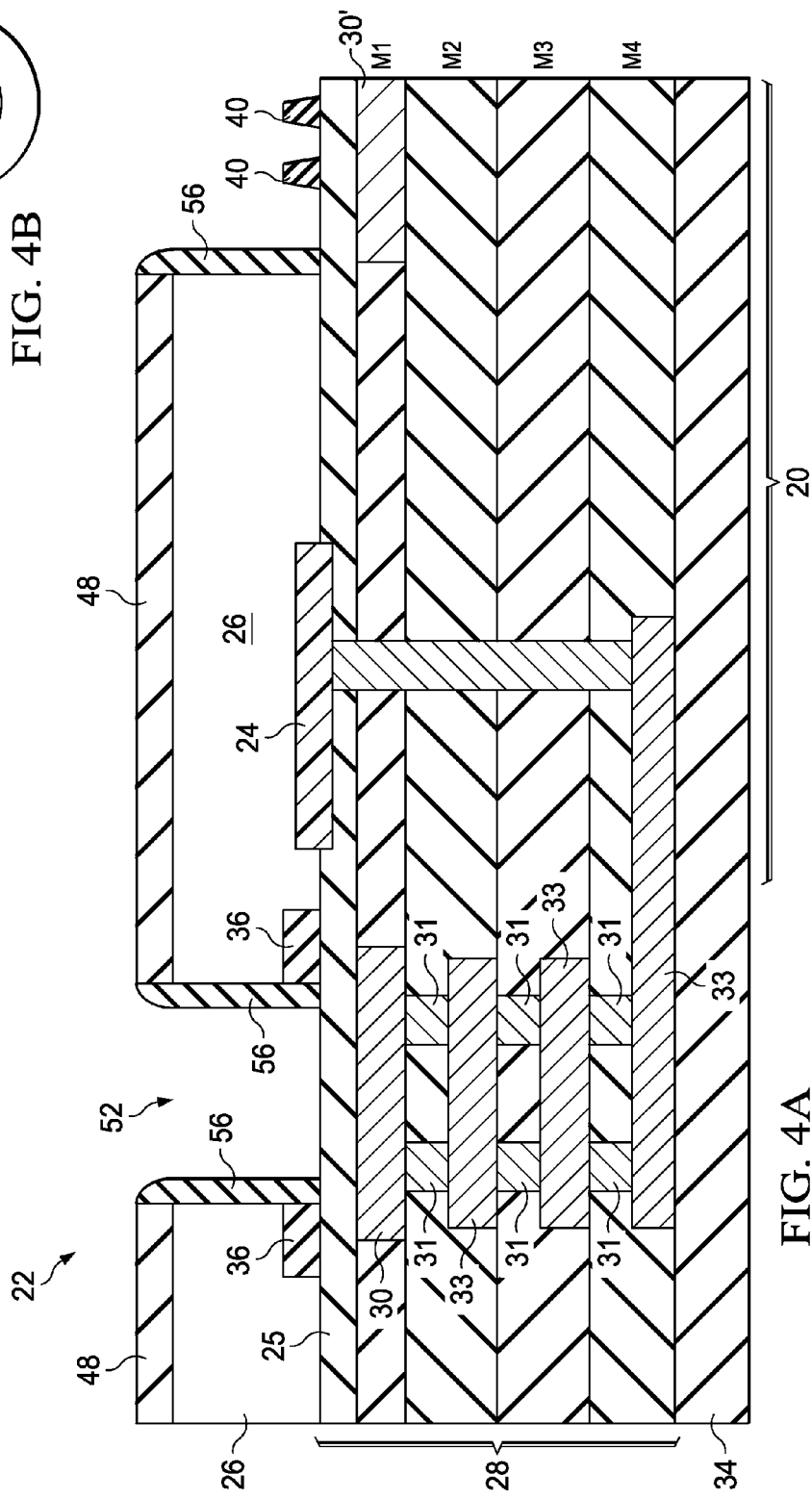

FIG. 4B illustrates a top view of a portion of the structure shown in FIG. 4A. In an embodiment, the remaining portion of STI pad 36 encircles sidewall spacer 56, which further forms a ring encircling opening 52. Although in the top view, the remaining portion of STI pad 36 and opening 52 are shown as having circular shapes, they may have other shapes such as rectangular shapes, hexagon shapes, or the like.

Figure 5:
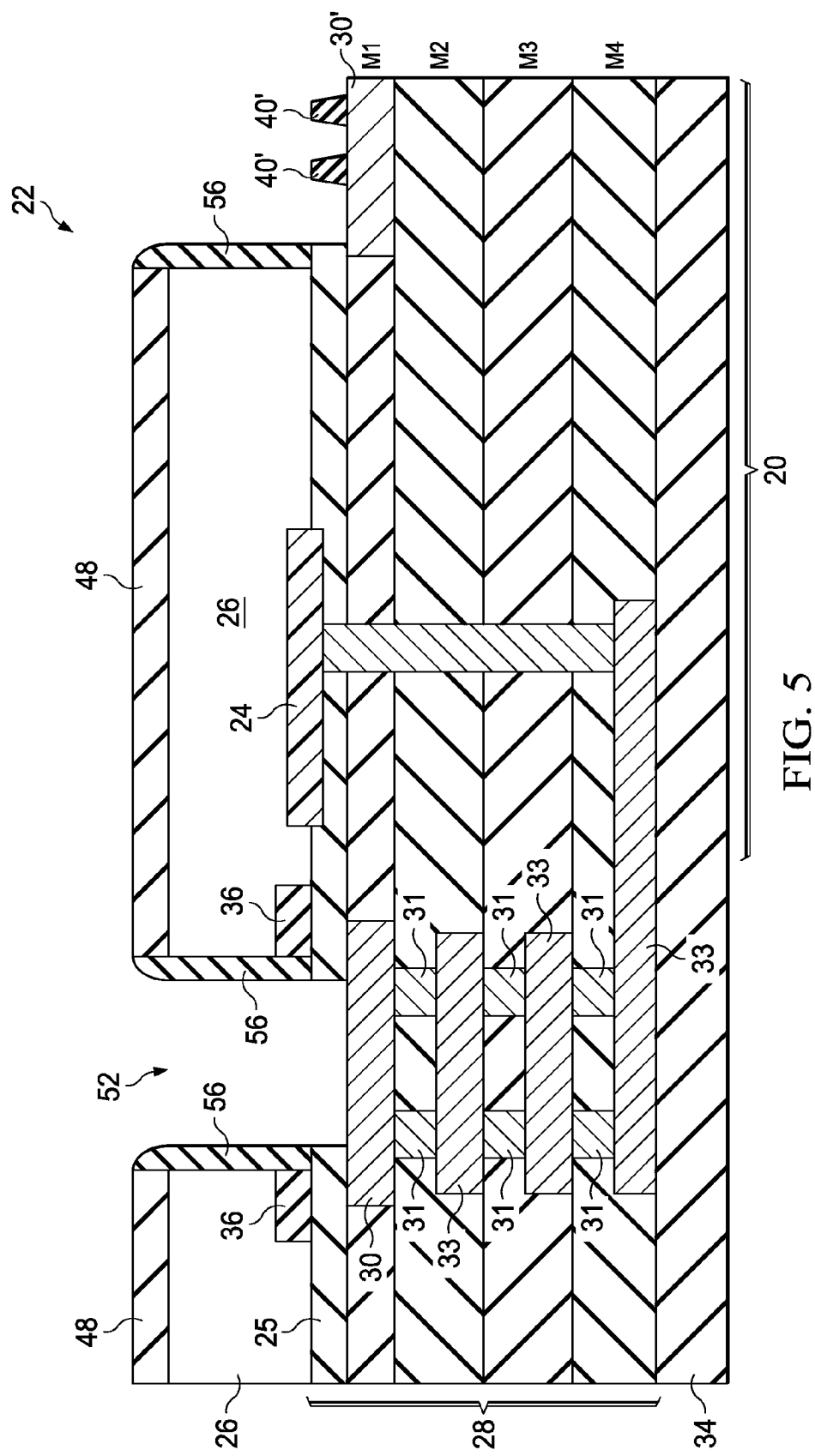

In FIG. 5, the exposed portion of ILD 25 is etched. Opening 52 thus extends down, and metal pad 30 is exposed through opening 52. In addition, the pattern of SPM 40 (FIG. 4A) is transferred to ILD 25 due to the etching effect, and SPM 40' is formed. The transferring of SPM 40 is self-aligned since its pattern is copied from that in FIG. 2. Similarly, the etching for forming SPM 40' may be stopped by metal pad 30', which is in the same metal layer as metal pad 30, and may be in metal layer M1.

Figure 6:
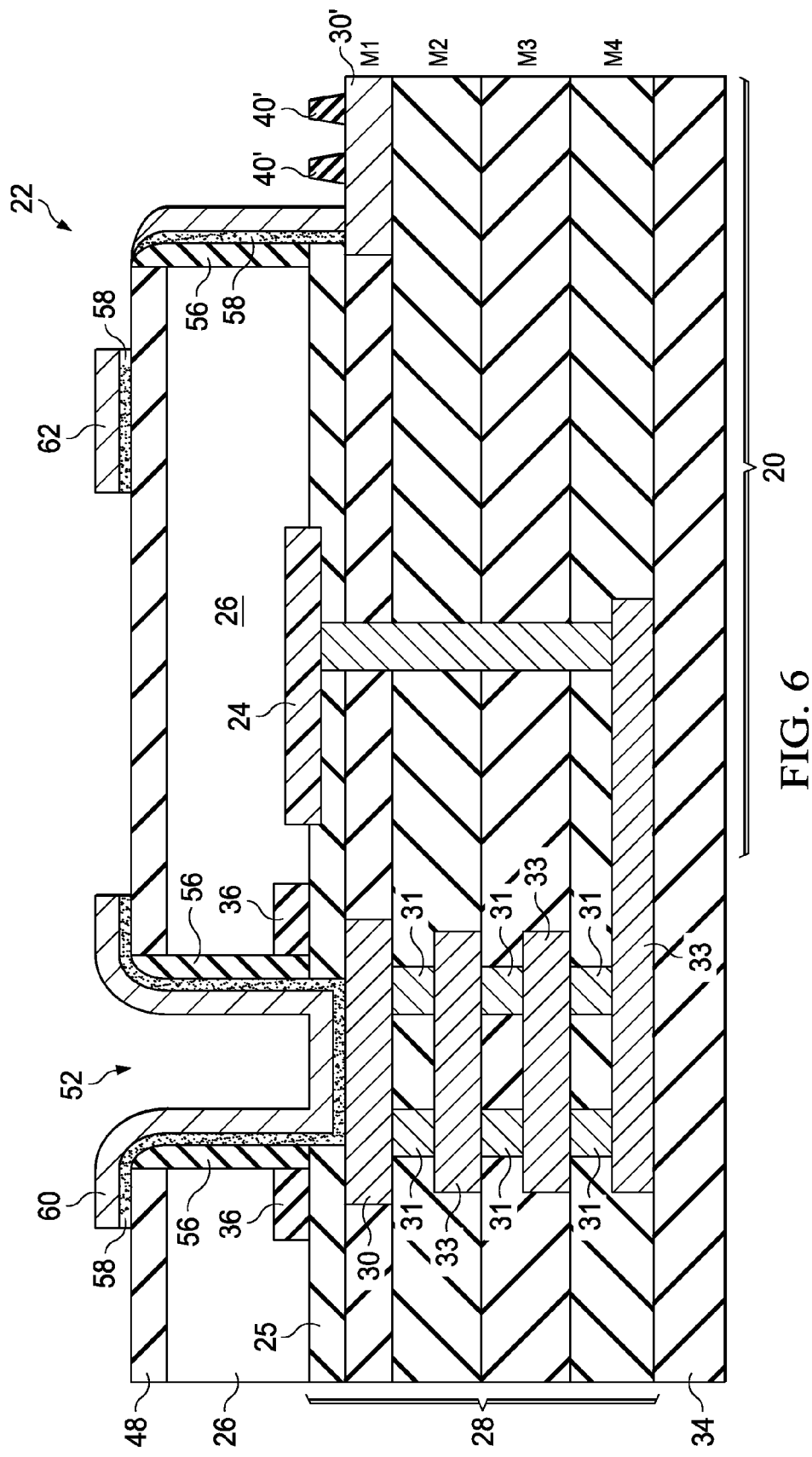

FIG. 6 illustrates the formation and the patterning of barrier layer 58 (also referred to as a glue layer), metal bond pad 60, and metal shield 62. The formation processes comprise depositing a blanket barrier layer, depositing a metal pad layer over the blanket barrier layer, and patterning the blanket barrier layer and the metal pad layer to form the structure shown in FIG. 6. Barrier layer 58 may be formed of tantalum, tantalum nitride, titanium, titanium nitride, and multi-layers thereof. Metal bond pad 60 and metal shield 62 may be formed of an aluminum containing metallic material, which may be aluminum copper, for example, although other metals and metal alloys may also be used. During the patterning, the portions of the metal pad layer and the barrier layer that are directly over SPM 40' are also removed, and hence SPM 40' is exposed.

Figure 7:
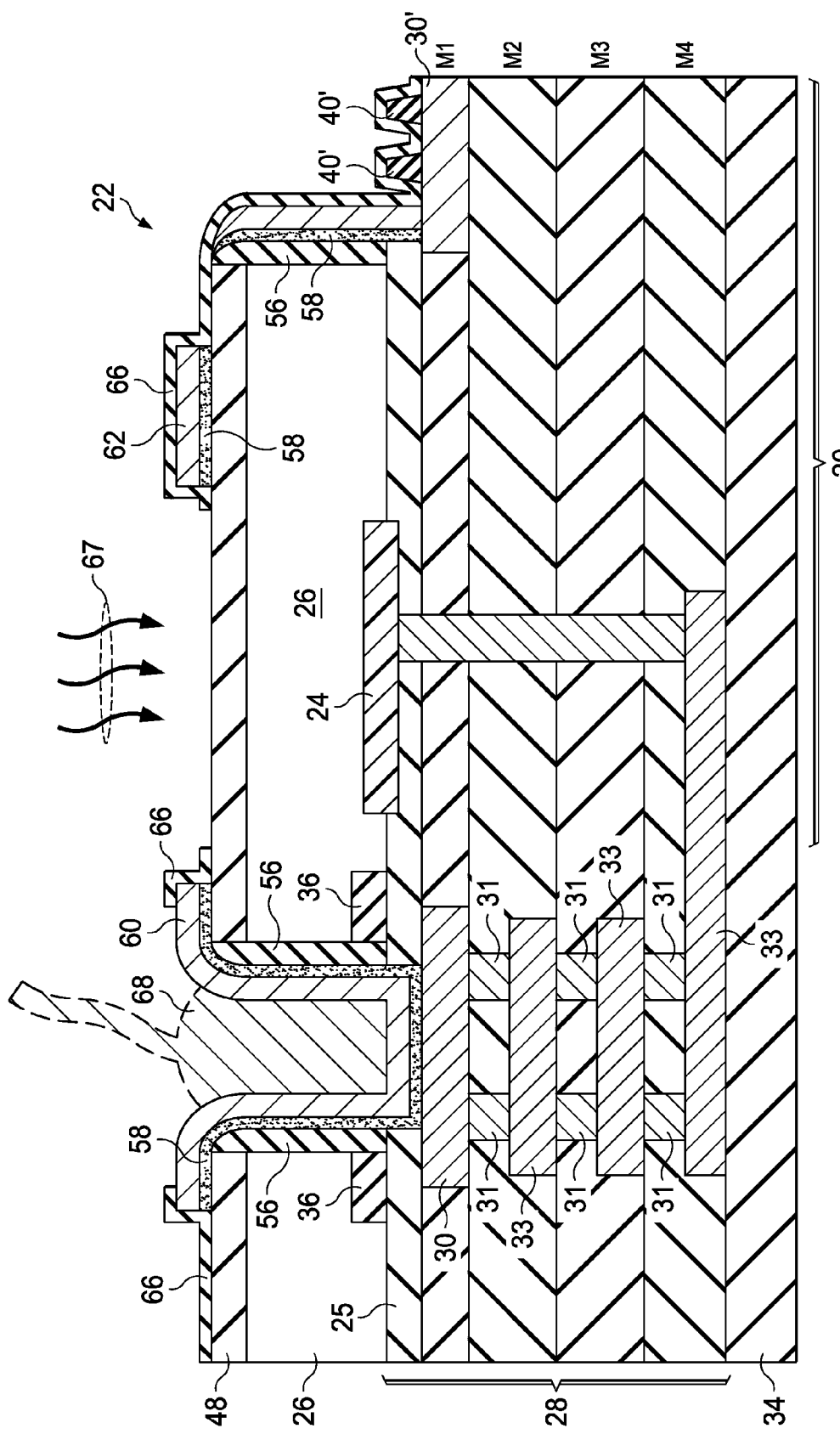

FIG. 7 illustrates the formation of passivation layer 66, which is formed of a dielectric material. In an embodiment, passivation layer 66 comprises a silicon oxide layer and a nitride layer over the silicon oxide layer, although it may also be formed of other dielectric materials such as USG. Passivation layer 66 is patterned, so that metal bond pad 60 is exposed for the future bonding. Metal shield 62 and SPM 40' are covered by passivation layer 66. Passivation layer 66 is also removed from directly over image sensor 24, so that color filters and lenses (not shown) may be formed directly over image sensor 24. Passivation layer 66 may be left on SPM 40'. In the formation of the color filters and lenses, SPM 40' may be used as an alignment mark. In the resulting structure, light (symbolized with arrows 67) may penetrate through the color filters and lenses, buffer oxide layer 48, and semiconductor substrate 26 to reach image sensor 24, which converts the light to an electrical signal.

In an embodiment, wire bond bump 68, which may comprise gold, aluminum and/or other metal, is bonded to metal bond pad 60 in a subsequent step. The bonding may be performed after the formation of the color filters and lenses, and after image sensor chip 20 is sawed from wafer 22. In the resulting structure, dielectric spacer 56 electrically insulates metal bond pad 60 from semiconductor substrate 26, and electrically insulates metal bond pad 60 from other metal pads on the same chip.

Figure 8:
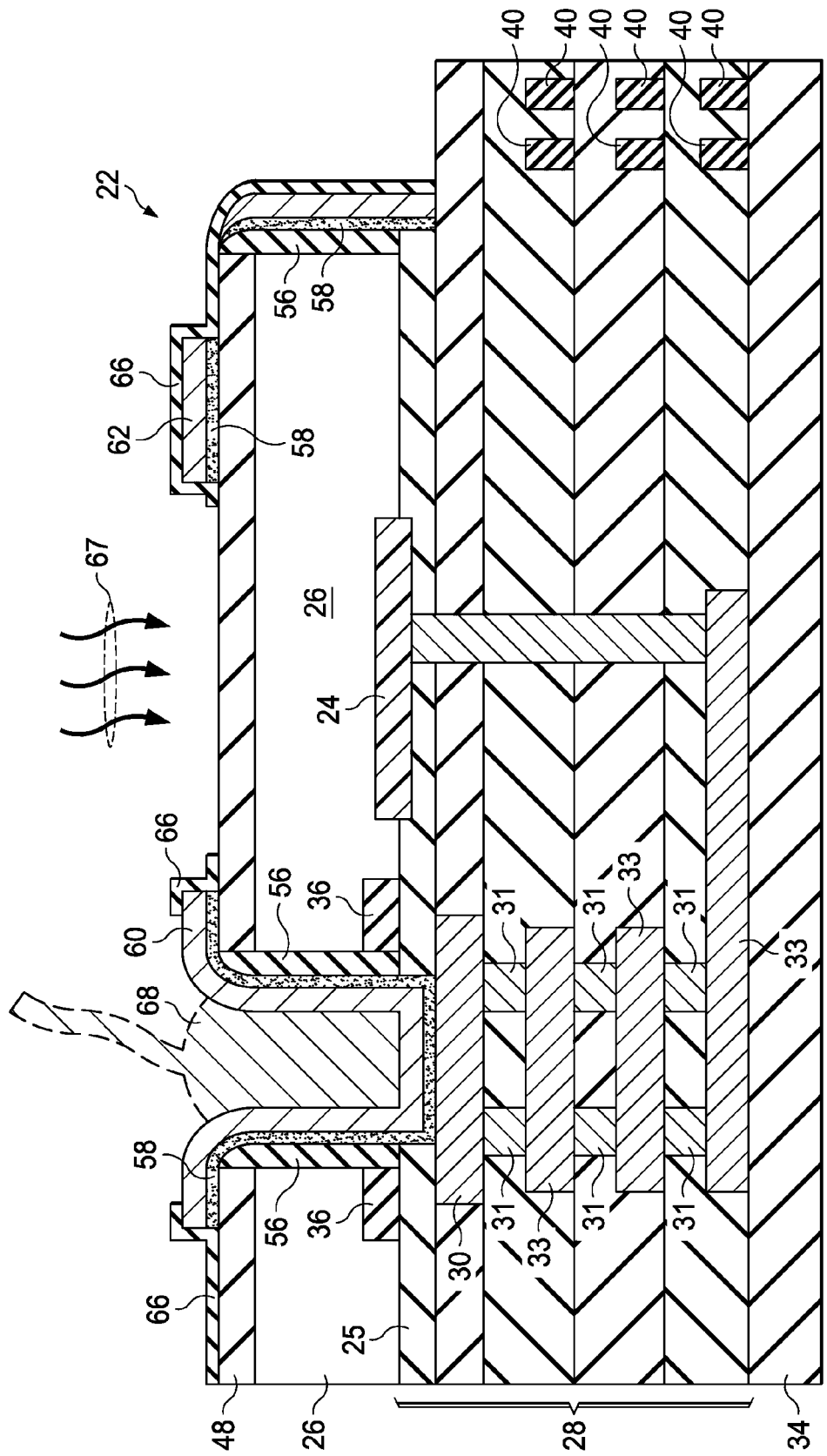
FIG. 8 illustrates a cross-sectional view of an image sensor chip in accordance with various alternative embodiments, wherein a SPM is formed in one of metal layers.

FIG. 8 illustrates image sensor wafer 22 in accordance with alternative embodiments. Unless specified otherwise, the reference numerals in these embodiments represent like elements in the embodiments illustrated in FIGS. 1 through 7. The process steps for forming the structure as shown in FIG. 8 are not discussed herein, and one of ordinary skill in the art will be able to find out the formation details by applying the teaching related to the embodiment shown in FIGS. 1 through 7. The structure shown in FIG. 8 differs from the structure shown in FIG. 7 in that SPM 40 is not formed of the ILD material as shown in FIG. 7. Instead, SPM 40 is formed in one of metal layers M1 through Mtop. Although SPM 40 is illustrated as being formed in metal layer M2, dashed patterns illustrate that alternative SPMs 40 may be formed in different metal layers such as M3, M4, or the like. To form the structure as shown in FIG. 8, SPM 40 is pre-formed at the time interconnect structure 28 is formed. In the embodiments shown in FIG. 8, passivation layer 66 may be removed from directly over SPM 40 to allow the easy penetration of light.

In the embodiments, a same mask, as shown in FIG. 2, is used to etch semiconductor substrate 26 and STI pad 36. As a comparison, in conventional processes for forming pad structures, two masks were needed, with the first mask used for etching a semiconductor substrate, and the second mask used for etching STI pads. Therefore, the manufacturing cost is reduced due to the elimination of one mask and the respective photolithography processes.

In accordance with embodiments, an integrated circuit structure includes an interconnect structure that includes a plurality of metal layers, wherein the interconnect structure is under a semiconductor substrate. A metal pad is formed in one of the plurality of metal layers. A dielectric pad extends from a bottom surface of the semiconductor substrate up into the semiconductor substrate. An opening extends from a top surface of the semiconductor substrate down to penetrate through the semiconductor substrate and the dielectric pad. An edge of the semiconductor substrate in the opening is vertically aligned to an edge of the dielectric pad in the opening. The opening stops on a top surface of the metal pad. A dielectric spacer is disposed in the opening, wherein the dielectric spacer is formed on the edge of the semiconductor substrate and the edge of the dielectric pad.

In accordance with other embodiments, an integrated circuit structure includes a semiconductor substrate, and an ILD under the semiconductor substrate. A metal pad is disposed under the ILD. An STI pad is disposed over the ILD and in the semiconductor substrate. A buffer oxide layer is over the semiconductor substrate. An opening extends down from a top surface of the buffer oxide layer to penetrate through the buffer oxide layer, the semiconductor substrate, the STI pad, and the ILD, wherein an edge of the semiconductor substrate in the opening is vertically aligned to an edge of the STI pad in the opening. A bottom of the opening is at a top surface of the metal pad. A dielectric spacer is disposed in the opening, wherein the dielectric spacer includes an outer edge. Portions of the outer edge contact the edge of the semiconductor substrate, an edge of the buffer oxide layer, and the edge of the STI pad. A metal bond pad is disposed in the opening, wherein the metal bond pad has an outer edge contacting an inner edge of the dielectric spacer.

In accordance with yet other embodiments, a method includes etching a semiconductor substrate from a backside of the semiconductor substrate to form an opening, wherein the semiconductor substrate and an STI pad in the semiconductor substrate are etched using a same mask. A dielectric spacer is formed on a sidewall of the opening, wherein the dielectric spacer is on an edge of the semiconductor substrate in the opening and an edge of the STI pad in the opening. An ILD is etched through the opening to expose a metal pad under the ILD. A metal bond pad is then formed in the opening, wherein the metal bond pad is electrically coupled to the metal pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
    a semiconductor substrate;
    an interconnect structure comprising a plurality of metal layers under the semiconductor substrate;
    a metal pad in one of the plurality of metal layers;
    a dielectric pad extending from a bottom surface of the semiconductor substrate up into the semiconductor substrate; and
    a dielectric spacer extending from a top surface of the semiconductor substrate down to penetrate through the semiconductor substrate and the dielectric pad, wherein an edge of the semiconductor substrate in contact with the dielectric spacer is vertically aligned to an edge of the dielectric pad in contact with the dielectric spacer.

2. The integrated circuit structure of claim 1 further comprising a metal bond pad electrically coupled to the metal pad, and wherein the metal bond pad is electrically insulated from the semiconductor substrate by the dielectric spacer.

3. The integrated circuit structure of claim 2, wherein the dielectric spacer forms a ring encircling the metal bond pad in a top view of the integrated circuit structure.

4. The integrated circuit structure of claim 1, wherein the dielectric pad encircles the dielectric spacer in a top view of the integrated circuit structure.

5. The integrated circuit structure of claim 1 further comprising an interlayer dielectric (ILD) disposed between the dielectric pad and the metal pad, wherein the dielectric spacer comprises a bottom surface landing on a top surface of the ILD.

6. The integrated circuit structure of claim 5 further comprising an alignment mark as a portion of the ILD, wherein the semiconductor substrate does not extend to directly over the alignment mark.

7. The integrated circuit structure of claim 1 further comprising an alignment mark in one of the plurality of metal layers, wherein the semiconductor substrate does not extend to directly over the alignment mark.

8. The integrated circuit structure of claim 1 further comprising an image sensor disposed at the bottom surface of the semiconductor substrate.

9. An integrated circuit structure comprising:
    a semiconductor substrate;
    an interlayer dielectric (ILD) under the semiconductor substrate;
    a metal pad under the ILD;
    a shallow-trench isolation (STI) pad over the ILD and in the semiconductor substrate;
    a buffer oxide layer over the semiconductor substrate;
    a dielectric spacer extending down from a top surface of the buffer oxide layer to penetrate through the buffer oxide layer, the semiconductor substrate, the STI pad, and the ILD, wherein an edge of the semiconductor substrate in contact with an outer edge of the dielectric spacer is vertically aligned to an edge of the STI pad in contact with the outer edge of the dielectric spacer; and
    a metal bond pad having an outer edge contacting an inner edge of the dielectric spacer.

10. The integrated circuit structure of claim 9 further comprising a wire bond bump bonded to the metal bond pad.

11. The integrated circuit structure of claim 9, wherein the metal bond pad is in physical contact with the metal pad.

12. The integrated circuit structure of claim 9, wherein the dielectric spacer forms a ring encircling the metal bond pad, and wherein the STI pad encircles the dielectric spacer.

13. The integrated circuit structure of claim 9 further comprising an alignment mark as a portion of the ILD, wherein the semiconductor substrate does not extend to directly over the alignment mark.

14. The integrated circuit structure of claim 9 further comprising an alignment mark in a metal layer under the ILD, wherein the semiconductor substrate does not extend to directly over the alignment mark.

15. A method comprising:
   etching a semiconductor substrate from a backside of the semiconductor substrate to form an opening, wherein the semiconductor substrate and a shallow-trench isolation (STI) pad in the semiconductor substrate are etched using a same mask;
   forming a dielectric spacer on a sidewall of the opening, wherein the dielectric spacer is on an edge of the semiconductor substrate in the opening and an edge of the STI pad in the opening;
   etching an interlayer dielectric (ILD) exposed through the opening to expose a metal pad under the ILD; and
   forming a metal bond pad in the opening, wherein the metal bond pad is electrically coupled to the metal pad.

16. The method of claim 15, wherein the step of etching the semiconductor substrate stops on a top surface of the ILD, and wherein the step of forming the dielectric spacer comprises:
   forming an dielectric layer on the ILD and on the sidewall of the opening; and
   removing horizontal portions of the dielectric layer, wherein vertical portions of the dielectric layer on the sidewall of the opening form the dielectric spacer.

17. The method of claim 15, wherein the step of etching the ILD is performed after the step of forming the dielectric spacer.

18. The method of claim 15 further comprising forming an alignment mark at a same level as the STI pad, wherein a pattern of the alignment mark is transferred into the ILD during the step of etching the ILD.

19. The method of claim 15 further comprising, before the step of forming the opening, forming an alignment mark in a metal layer under the ILD, wherein a portion of the semiconductor substrate directly over the alignment mark is removed in the step of etching the semiconductor substrate.

20. The method of claim 15 further comprising, before the step of etching the semiconductor substrate:
   forming an image sensor at a front side of the semiconductor substrate;
   performing a backside thinning to thin the semiconductor substrate; and
   forming a buffer oxide layer on the backside of the semiconductor substrate, wherein in the step of etching the semiconductor substrate, the buffer oxide layer is etched.

* * * * *